United States Patent
Bi

(10) Patent No.: US 8,757,473 B2
(45) Date of Patent: Jun. 24, 2014

(54) PROCESS FOR MAKING A HEAT RADIATING STRUCTURE FOR HIGH-POWER LED

(75) Inventor: Xiaofeng Bi, Guangdong (CN)

(73) Assignee: Dongguan Kingsun Optoelectronic Co., Ltd, Dongguan (CN)

( * ) Notice: Subject to any disclaimer, the term of this patent is extended or adjusted under 35 U.S.C. 154(b) by 0 days.

(21) Appl. No.: 13/989,818

(22) PCT Filed: Aug. 30, 2012

(86) PCT No.: PCT/CN2012/080773
§ 371 (c)(1),
(2), (4) Date: May 28, 2013

(87) PCT Pub. No.: WO2013/067842
PCT Pub. Date: May 16, 2013

(65) Prior Publication Data
US 2013/0248584 A1    Sep. 26, 2013

(30) Foreign Application Priority Data
Nov. 9, 2011   (CN) .......................... 2011 1 0351480

(51) Int. Cl.
*B23K 31/02*   (2006.01)
(52) U.S. Cl.
USPC ...................... 228/135; 228/180.1; 228/248.1
(58) Field of Classification Search
None
See application file for complete search history.

(56) References Cited

U.S. PATENT DOCUMENTS 5,082,355 A * 1/1992 Warszawski .................. 359/265
2003/0193803 A1* 10/2003 Lin ................................ 362/250
2005/0141828 A1* 6/2005 Narayan et al. ................. 385/92
2006/0249835 A1* 11/2006 Miyauchi ...................... 257/706
2007/0235739 A1* 10/2007 Sun et al. ......................... 257/79
2009/0003003 A1* 1/2009 Park ............................... 362/373
2009/0095513 A1* 4/2009 Oshika et al. ................. 174/257
2009/0159902 A1* 6/2009 Yasuda et al. .................. 257/88
2010/0025720 A1* 2/2010 Naum et al. ..................... 257/99
2012/0058676 A1* 3/2012 Schaffer et al. .......... 439/620.21
2013/0107549 A1* 5/2013 Yeh ................................ 362/382
2013/0121007 A1* 5/2013 Yu et al. ........................ 362/382
2013/0146646 A1* 6/2013 Suzuki et al. ............. 228/180.1
2013/0153277 A1* 6/2013 Menard et al. ................ 174/260
2013/0206230 A1* 8/2013 Sridharan et al. ............. 136/259

FOREIGN PATENT DOCUMENTS

CN    201112413 Y  *  9/2008
CN    102403419 A  *  4/2012

OTHER PUBLICATIONS

Machine translation of CN-102403419A (no date available).*

* cited by examiner

*Primary Examiner* — Kiley Stoner

(57) ABSTRACT

A process of making a heat radiating structure for high-power LED comprises: (1) providing a PCB board, a heat conducting plate and a heat radiating plate; (2) providing a first locating hole and a first fixation hole penetrating the PCB board, and welding a copper plate to one side of the PCB board; while soldering an electrode welding leg to the other side of the PCB board; (3) providing a second locating hole and a second fixation hole penetrating the heat conducting plate; (4) using a fixation column to pierce through both of the fixation holes for connecting together the PCB board and the heat conducting plate; (5) using a heat conducting column to pierce through both of the locating holes; (6) placing the integral piece of the heat conducting plate and the PCB board on a pressing equipment to adjust the height of the heat conducting column.

9 Claims, 1 Drawing Sheet

PROCESS FOR MAKING A HEAT RADIATING STRUCTURE FOR HIGH-POWER LED

FIELD OF THE INVENTION

The present invention relates to a technology of making a heat radiating device, more particularly, to a process of making a heat radiating structure for high-power LED.

BACKGROUND OF THE INVENTION

LED has been widely used in many applications such as indicative marks application and indoor/outdoor lighting application, due to its long theoretical lifetime, low energy consumption, eco-friendly characteristic and the like. As we all know, the most crucial factor affecting the lifetime of LED is LED's heat radiation, and this is especially true for high-power LED. Existing method of making a heat radiating structure for high-power LED mainly includes successively connecting a heat sink, an aluminum substrate, a heat conductive silicone grease, a heat radiating plate and other parts together, the LED thus connects with the aluminum substrate through the heat sink, this is a simple method, however, the resulting heat radiating structure has poor performance in thermal conduction and radiation, which is largely ascribed to the structural setting of the aluminum substrate, this poor performance hence greatly affects the application field as well as the application range of the LED. The aluminum substrate is usually formed by successively superposing a protective oil layer, a copper foil layer, an insulating layer and an aluminum plate layer, whilst the insulating layer plays a positive role in electric insulation, it plays a role in thermal insulation which is not expected, hence heat produced by the LED cannot be removed timely, which finally largely affects the lifetime of the LED. Consequently, technological innovations should be made in the field of making heat radiating structures for LED to realize differentiated heat radiating structures and to solve the problem of heat radiation of the LED.

SUMMARY OF THE INVENTION

The object of the present invention is to provided a process of making a heat radiating structure for high-power LED with simple process and high production efficiency so as to overcome the above shortcomings in the prior arts, and the resulting heat radiating structure made by this process has a compact structure and is efficient in radiating heat.

In order to achieve the above object, the present invention provides the following technical solutions.

A process of making a heat radiating structure for high-power LED comprises:

(1) providing a PCB board, a heat conducting plate and a heat radiating plate;

(2) providing a first locating hole and a first fixation hole penetrating both sides of the PCB board, and welding a copper plate to one side of the PCB board; while soldering an electrode welding leg to the other side of the PCB board, then coating the surface of the copper plate with a solder paste;

(3) providing a second locating hole and a second fixation hole penetrating both sides of the heat conducting plate;

(4) overlaying one side of the heat conducting plate with one side of the PCB board which side is provided with the copper plate, and the first locating hole being arranged in correspondence with the position of the second locating hole, similarly, the first fixation hole being arranged in correspondence with the position of the second fixation hole; using a fixation column to pierce through both of the first fixation hole and the second fixation hole for connecting together the PCB board and the heat conducting plate to form an integral piece of them;

(5) using a heat conducting column to pierce through both of the first locating hole and the second locating hole, and one end of the heat conducting column being protruded outside one side of the PCB board, the length of the protruding end of the heat conducting column being greater than the thickness of the electrode welding leg;

(6) placing the integral piece of the heat conducting plate and the PCB board produced by the step (5) on a pressing equipment, and utilizing the pressing equipment to press the upper-end surface of the heat conducting column so as to adjust the length of the protruding end of the heat conducting column, and to make the upper-end surface of the heat conducting column and the upper surface of the electrode welding leg be on the same plane;

(7) pasting the inner side of the heat radiating plate on the other side of the heat conducting plate fixedly.

Wherein in the step (5), the outer side of the heat radiating plate is provided with a plurality of heat radiating fins.

Wherein in the step (4), after the PCB board and the heat conducting plate has been fixedly connected together to form an integral piece of them, the heat conducting plate and the copper plate are soldered together through reflow soldering.

Wherein in the step (4), both of the first fixation hole and the second fixation hole are through-holes, and the fixation column is a rivet.

Wherein in the step (4), both of the first fixation hole and the second fixation hole are screw holes, and the fixation column is a screw.

Wherein in the step (1), the heat conducting column is threadedly connected with the first locating hole and the second locating hole.

Wherein in the step (1), the heat conducting plate is made from red copper based material.

Wherein in the step (1), the heat radiating plate is made from aluminum based material or copper based material.

Wherein in the step (1), the heat conducting column is made from red copper based material.

By using the above process, the advantages of the present invention are as follows: because the upper-end surface of the conducting column and the upper surface of the electrode welding leg are adjusted to be on the same plane, when the bottom of the base of LED is engaged with both of the electrode welding leg and the heat conducting column, the bottom of the base of LED could be fully contacted with the upper-end surface of the heat conducting column and a welded connection could be formed between them, without influencing the electric connection between the bottom of the base of LED and the electrode welding leg, hence the contact area between a heat conduction portion at the bottom of the base of LED and the upper-end surface of the heat conducting column is increased, in this way, the heat radiating structure made by the process of the preset invention could quickly remove out the heat produced by the LED through the heat conducting column and the heat conducting plate, consequently, its function of thermal conduction and radiation is greatly enhanced.

APPENDED DRAWING REFERENCE SIGNS

Figure 1:
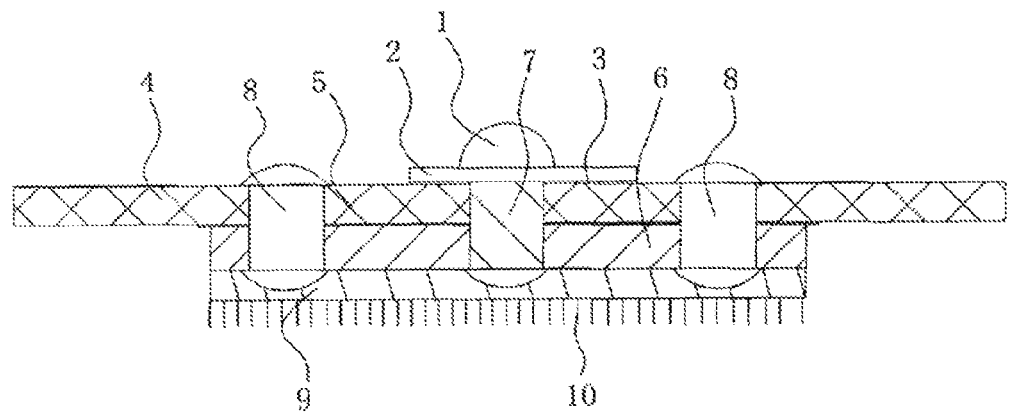
FIG. 1 is a sectional view of the heat radiating structure made by the process of the present invention.

1 LED;
2 base
3 electrode welding leg
4 PCB board
5 copper plate
6 heat conducting plate
7 heat conducting column
8 fixation column
9 heat radiating plate
10 heat radiating fin
41 a first locating hole
42 a first fixation hole
61 a second locating hole
62 a second fixation hole

DETAILED DESCRIPTION OF THE PREFERRED EMBODIMENTS OF THE INVENTION

Figure 2:
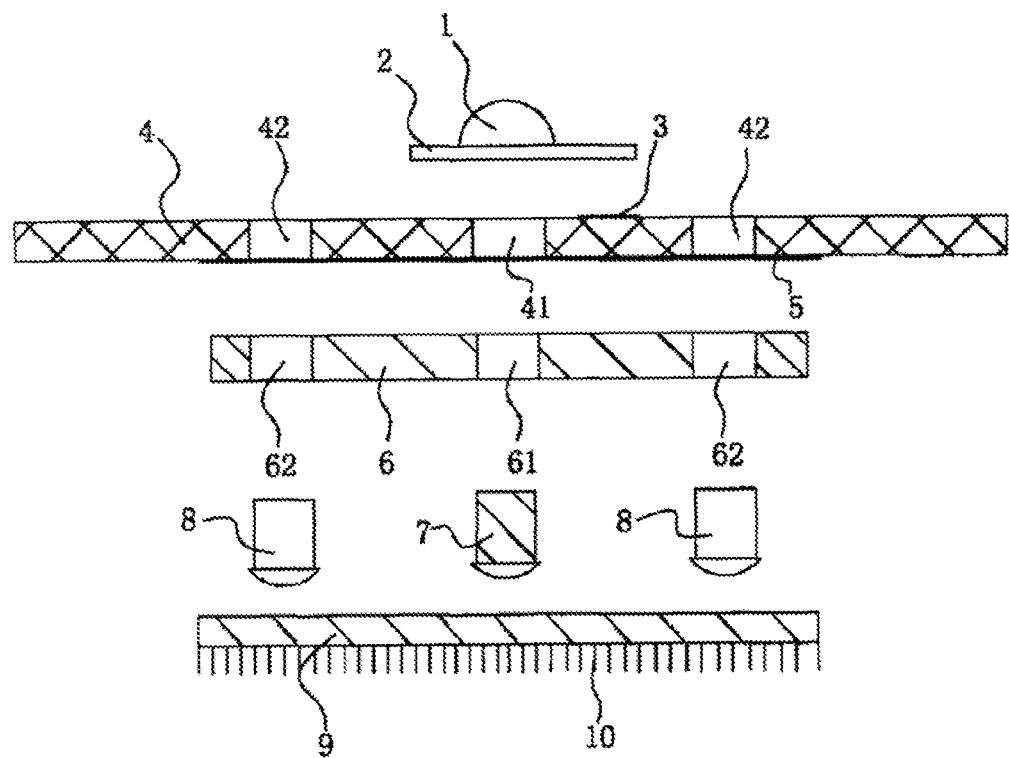
FIG. 2 is an explosive view of the heat radiating structure made by the process of the present invention.

Steps of the process of the present invention will be more fully understood and appreciated from the following detailed description, taken in conjunction with the drawings, in which FIG. 1 and FIG. 2 are integral view and explosive view of the heat radiating structure made by the process of the present invention respectively.

The process of making a heat radiating structure for high-power LED in the present invention comprises the following steps.

(1) Provide a PCB board 4, a heat conducting plate 6, a heat radiating plate 9, and other components or materials; wherein the heat conducting plate 6 is made from red copper based material, aluminum based material and the like, the heat conducting column 8 is made from red copper based material and the heat radiating plate 9 is made from aluminum based material or copper based material. Both aluminum based material and copper based material function well in thermal conduction and radiation, the heat conducting plate 6 and the heat radiating plate 9 in the present invention are made from aluminum based material and the copper based material, which helps to achieve the objective of the present invention. Obviously, main bodies of the above-described structures could be made from other metal materials having good performance in conducting and radiating heat. The heat conducting column 8 could be formed in one piece with the heat conducting plate 6, alternatively, the heat conducting column 8 could be in the form of an attachment piece which is fixedly welded to the heat conducting plate 6.

(2) Provide a first locating hole 41 and a first fixation hole 42 penetrating both sides of the PCB board 4, and weld a copper plate 5 to one side of the PCB board 4, then coat the surface of the copper plate 5 with a solder paste for fixedly welding the heat conducting plate 6; solder an electrode welding leg 3 to the other side of the PCB board 4 for connecting with an electrode portion at the bottom of the base 2 of the LED 1.

(3) provide a second locating hole 61 and a second fixation hole 62 penetrating both sides of the heat conducting plate 6.

It is of note that in order to enhance the stability of the structure made by the process of the present invention, there could be a plurality of the first fixation holes 42 distributed homogeneously around the first locating hole 41, similarly, there could be a plurality of the second fixation holes 62 distributed homogeneously around the second locating hole 61. There is a one-to-one correspondence between the first fixation holes 42 and the second fixation holes 62 in terms of their position and number when both of them are multiple.

(4) overlay one side of the heat conducting plate 6 with one side of the PCB board 4 which side is provided with the copper plate 5, and arrange the first locating hole 41 in correspondence with the position of the second locating hole 61, similarly, arrange the first fixation hole 42 in correspondence with the position of the second fixation hole 62; use a fixation column 8 to pierce through both of the first fixation hole 42 and the second fixation hole 62 for connecting together the PCB board 4 and the heat conducting plate 6 to form an integral piece of them. Wherein, when both of the first fixation hole 42 and the second fixation hole 62 are through-holes, the fixation column 8 is a rivet, and a riveted connection is formed between the heat conducting plate 6 and the PCB board 4, then the rivet is pressed by using a pressing equipment; when both of the first fixation hole 42 and the second fixation hole 62 are screw holes, the fixation column 8 is a screw, and a screwed connection is formed between the heat conducting plate 6 and the PCB board 4.

In addition, the heat conducting plate 6 and copper plate 5 are fixedly welded together, which further enhances the stability and compactness of the structure made the process of the present invention.

(5) use the heat conducting column 7 to pierce through both of the first locating hole 41 and the second locating hole 61, and one end of the heat conducting column 7 being protruded outside one side of the PCB board 4, the length of the protruding end of the conducting column 7 being greater than the thickness of the electrode welding leg 3; the shape and size of the heat conducting column 7 match with that of the first locating hole 41 and the second locating hole 61, specifically, the cross section of the heat conducting column 8 could be in the shape of round, oval, triangle or hexagon, when the cross section of the heat conducting column 7 has a round shape, the inner wall of the first locating hole 41 as well as the second locating hole 61 is provide with internal screw threads, while the side wall of the heat conducting column 7 is provide with external screw threads, the heat conducting column 7 is then threadedly connected with the first locating hole 41 and the second locating hole 61. The screwed connections between the heat conducting column 7 and both of the first locating hole 41 and the second locating hole 61 could improve the compactness of the heat radiating structure of the present invention, and indirectly improve its function in conducting and radiating heat.

(6) place the integral piece of the heat conducting plate 6 and the PCB board 4 produced by the step (5) on a pressing equipment, and utilize the pressing equipment to press the upper-end surface of the heat conducting column 7 so as to adjust the length of the protruding end of the conducting column 7, and to make the upper-end surface of the conducting column 7 and the upper surface of the electrode welding leg 3 be on the same plane. This is a key step in the process of the present invention, as mentioned above, one end of the conducting column 7 is protruded outside one side of the PCB board 4 and the length of the protruding end of the conducting column 7 is greater than the thickness of the electrode welding leg 3, then the pressing equipment is utilized to press the heat conducting column 7, hence the upper-end surface of the heat conducting column 7 is pressed and the length is adjusted until the length of the protruding end of the conducting column 7 is equal to the thickness of the electrode welding leg 3. After the process of pressing, the area of cross section of the heat conducting column 7 becomes larger, and an interference fit thus could be formed between the heat conducting column 7 and the first locating hole 41 as well as the second locating hole 61, so that the contact area between the heat conducting column 7 and an heat conduction portion at the bottom of the base 2 becomes larger, which facilitates heat conduction; at the same time, the upper-end surface of the heat conducting column 7 and the upper surface of the electrode welding leg 3 are on the same plane, in this way, the bottom of the base 2 could fully engage with both the upper-end surface of the heat conducting column 7 and the upper surface of the electrode welding leg 3, hence, the electrode portion at the bottom of the base 2 could be fully contacted with and welded with the electrode welding leg 3, the heat conduction portion at the bottom of the base 2 could also be fully contacted with and welded with the upper-end surface of the heat conducting column 7, the contact area between the heat conduction portion at the bottom of the base 2 and the upper-end surface of the heat conducting column 7 should be as large as possible to ensure that heat produced from the LED 1 could be timely transferred from the conducting column 7 and the heat conducting plate 6 to the heat radiating plate 9, and finally dissipated from the heat radiating plate 9.

(7) paste the inner side of the heat radiating plate 9 on the other side of the heat conducting plate 6 fixedly, the heat radiating plate 9 then could dissipate the heat within the heat conducting plate 6 timely. The outer side of the heat radiating plate 9 is provided with a plurality of heat radiating fins 10 to provide an increased radiating area for the heat radiating plate 9, which further enhances the heat dissipating effect of the heat radiating plate 9.

The heat radiating structure made by the process of the present invention could quickly remove the heat produced from the LED, its thermal conduction effect as well as thermal radiation effect is greatly enhanced over that of the prior art.

TABLE 1

Measured temperatures of existing heat radiating structure (old) and the heat radiating structure made by the method of the present invention (new)

| | Input current | Environmental temperature | heat sink (old); heat conducting column (new) | aluminum substrate (old); heat conducting plate (new) | heat radiating plate |
|---|---|---|---|---|---|
| heat radiating structure (old) | 700 mA | 24.3° C. | 57.3° C. | 44.7° C. | 45.2° C. |
| heat radiating structure (new) | 700 mA | 28° C. | 48.1/51° C. | 47.3/50.3° C. | 45.6/50.3° C. |

It can be seen from the above table, high-power LEDs respectively equipped with new heat radiating structure and old heat radiating structure were used, when the same current passed through the LEDs, the temperature of the heat conducting column of new heat radiating structure was obviously lower than that of the heat sink of old heat radiating structure though the environmental temperature was higher for new heat radiating structure, however, the temperatures of the heat conducting plate and the heat radiating plate of new heat radiating structure were respectively higher than that of the aluminum substrate and the heat radiating plate of old heat radiating structure, these results fully proved that thermal radiation effect of new heat radiating structure made by the process of the present invention is better than that of old heat radiating structure.

While the preferred embodiments of the invention have been described above, it will be recognized and understood that various modifications may be made therein, and the appended claims are intended to cover all such modifications which may fall within the spirit and scope of the invention.

What is claimed is:

1. A process of making a heat radiating structure for LED comprises:
   (1) providing a PCB board (4), a heat conducting plate (6) and a heat radiating plate (9);
   (2) providing a first locating hole (41) and a first fixation hole (42) penetrating both sides of the PCB board (4), and welding a copper plate (5) to one side of the PCB board (4); while soldering an electrode welding leg (3) to the other side of the PCB board (4), then coating the surface of the copper plate (5) with a solder paste;
   (3) providing a second locating hole (61) and a second fixation hole (62) penetrating both sides of the heat conducting plate (6);
   (4) overlaying one side of the heat conducting plate (6) with one side of the PCB board (4) which side is provided with the copper plate (5), and the first locating hole (41) being arranged in correspondence with the position of the second locating hole (61), similarly, the first fixation hole (42) being arranged in correspondence with the position of the second fixation hole (62); using a fixation column (8) to pierce through both of the first fixation hole (42) and the second fixation hole (62) for connecting together the PCB board (4) and the heat conducting plate (6) to form an integral piece of them;
   (5) using a heat conducting column (7) to pierce through both of the first locating hole (41) and the second locating hole (61), and one end of the heat conducting column (7) being protruded outside one side of the PCB board (4), a length of the protruding end of the heat conducting column (7) being greater than a thickness of the electrode welding leg (3);
   (6) placing the integral piece of the heat conducting plate (6) and the PCB board (4) produced by the step (5) on a pressing equipment, and utilizing the pressing equipment to press an upper-end surface of the heat conducting column (7) so as to adjust the length of the protruding end of the heat conducting column (7), and to make the upper-end surface of the heat conducting column (7) and the upper surface of the electrode welding leg (3) be on a same plane;
   (7) pasting an inner side of the heat radiating plate (9) on other side of the heat conducting plate (6) fixedly.

2. The process of making a heat radiating structure for LED as claimed in claim 1, wherein in the step (5), the outer side of the heat radiating plate (9) is provided with a plurality of heat radiating fins (10).

3. The process of making a heat radiating structure for LED as claimed in claim 1, wherein in the step (4), after the PCB board (4) and the heat conducting plate (6) have been fixedly connected together to form an integral piece of them, the heat conducting plate (6) and the copper plate (5) are soldered together through reflow soldering.

4. The process of making a heat radiating structure for LED as claimed in claim 1, wherein in the step (4), both of the first fixation hole (42) and the second fixation hole (62) are through-holes, and the fixation column (8) is a rivet.

5. The process of making a heat radiating structure for LED as claimed in claim 1, wherein in the step (4), both of the first fixation hole (42) and the second fixation hole (62) are screw holes, and the fixation column (8) is a screw.

6. The process of making a heat radiating structure for LED as claimed in claim 1, wherein in the step (1), the heat conducting column (8) is threadedly connected with the first locating hole (41) and the second locating hole (61).

7. The process of making a heat radiating structure for LED as claimed in claim 1, wherein in the step (1), the heat conducting plate (6) is made from red copper based material.

8. The process of making a heat radiating structure for LED as claimed in claim 1, wherein in the step (1), the heat radiating plate (9) is made from aluminum based material or copper based material.

9. The process of making a heat radiating structure for LED as claimed in claim 1, wherein in the step (1), the heat conducting column (8) is made from red copper based material.

\* \* \* \* \*